POWER AMPLIFIERS

Filed Nov. 14, 1952

INVENTOR.
ROBERT D. LOHMAN AND
GEORGE C. SZIKLAI
BY [signature]
ATTORNEY 2,985,841

POWER AMPLIFIERS

George C. Sziklai, Princeton, and Robert D. Lohman, Princeton Junction, N.J., assignors to Radio Corporation of America, a corporation of Delaware Filed Nov. 14, 1952, Ser. No. 320,542

4 Claims. (Cl. 330—14)

This invention relates to amplifiers capable of high current and power gains, and particularly, but not exclusively, to transistor power amplifiers capable of functioning in response to a pulse input in a manner somewhat analogous to the operation of a single pole double-throw switch.

In signalling, control, and other types of electrical systems, there often arises a need for a power amplification stage or circuit which presents a low output impedance to a subsequent stage or driven element. The present invention, employing a pair of semiconductor devices, provides such an amplification circuit with substantially high current and power handling capabilities.

In accordance with an embodiment of the present invention, the signal or impulse to be amplified is applied to the base electrode of a first transistor, the collector electrode of which is capacitively coupled to the base electrode of a second transistor. The collector electrode of the first transistor and the emitter electrode of the second transistor are respectively tied to operating potential sources of opposite polarity relative to signal reference or ground potential. A common output impedance is shared by the emitter circuit of the first transistor and the collector circuit of the second transistor. With suitable selection of biases such as for class A operation, the circuit may be balanced to provide zero load current in the absence of an input signal. There may thus be provided an amplified bidirectional signal output, free of any D.C. operating current component.

Moreover, in operation as a pulse amplifier, a selection of biases such that the first transistor is normally heavily conducting and the other is normally cut off produces particularly advantageous results. The action of the circuit under the latter bias and input conditions is somewhat analogous to the operation of a single-pole double-throw switch: i.e. the load being connected to a potential source of one polarity through one transistor during the occurrence of an input pulse, and being connected to a potential source of the opposite polarity through the other transistor in the absence of an input pulse. Significantly high current and power gains are realized, with the production of an output of bidirectional polarity.

An object of the present invention is to provide an improved power amplifier.

Another object of the present invention is to provide a transistor amplifier capable of substantial current and power gains.

An additional object of the present invention is to provide a power amplifier suitable for feeding low impedance loads.

A further object of the present invention is to provide a transistor amplifier having a low output impedance and high power handling capabilities.

Another object of the present invention is to provide an improved power amplifier having an output free of any D.C. operating current component.

An additional object of the present invention is to provide an improved transistor amplifier capable of delivering a bidirectional output to a low impedance load.

A further object of the present invention is to provide an improved pulse amplifier.

Another object of the present invention is to provide a transistor amplifier suitable for supplying pulse waveforms to a low impedance load.

An additional object of the present invention is to provide an improved pulse amplifier having an output of bidirectional polarity.

A further object of the present invention is to provide a transistor circuit capable of performing the functions of a single-pole double-throw switch.

Other and incidental objects and advantages of the present invention will be apparent to those skilled in the art from a reading of the following specification and an inspection of the accompanying drawings in which:

Fig. 1 shows a signal amplifier employing a pair of semiconductor devices $T_1$ and $T_2$, which are junction transistors of the p-n-p type.

Figure 1:
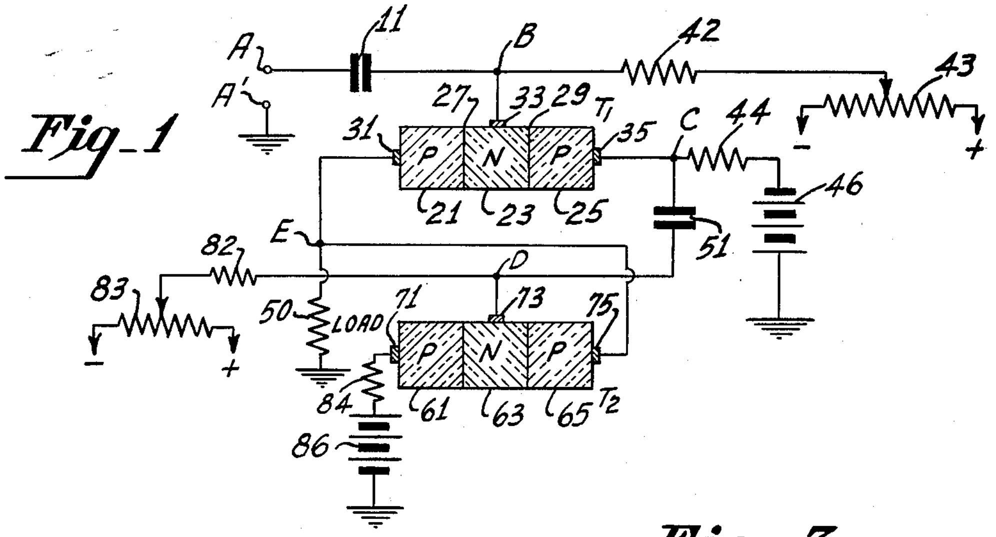
Fig. 1 is a schematic circuit diagram of a transistor amplifier, illustrative of an embodiment of the present invention.

The junction transistor $T_1$ comprises a body of semiconductive material, such as germanium or silicon, having two p-type regions 21 and 25, separated by and contiguous with opposite surface of an n-type region 23. Electrical "barriers," as discussed in U.S. Patent No. 2,569,347 to William Shockley, issued on September 25, 1951, occur at the interfacial junctions 27, 29. The electrodes 31, 33, and 35, by which external circuit connections are made to the respective regions 21, 23, and 25, make essentially ohmic (non-rectifying) contacts with their respective regions. In accordance with conventional nomenclature in the transistor art, the electrodes 31, 33, and 35 will be referred to as emitter, base, and collector, respectively.

A pair of input terminals, A and A′, to which input signals are applied, are provided, the terminal A being coupled by capacitor 11 to the base 33, and the terminal A′ being connected to a point of signal reference potential (i.e. ground in the illustrated embodiment). An adjustable bias is provided for the base 33 of the transistor $T_1$, as by connecting the base 33 via resistor 42 to an adjustable tap on the potentiometer 43, the fixed terminals of which are respectively connected to points of negative and positive potential relative to ground. The collector 35 is connected by means of a resistor 44 to a source of potential of negative polarity relative to ground, such as battery 46. The emitter 31 is connected to ground by means of a load impedance, symbolically indicated by resistor 50.

A second junction transistor $T_2$ similar to the transistor $T_1$, comprises a body of semiconductive material, such as germanium or silicon, having two p-type zones, 61 and 65, separated by and contiguous with opposite surfaces of an n-type zone 63. The electrodes 71, 73, and 75, in ohmic contact with the respective zones 61, 63, and 65, will be referred to as emitter, base, and collector, respectively.

An adjustable bias is provided for the base 73 of the transistor $T_2$, as by connecting the base 73 via resistor 82 to an adjustable tap on the potentiometer 83, the fixed terminals of which are respectively connected to points of negative and positive potential relative to ground. A capacitor 51 couples the base 73 to the collector 35 of the transistor $T_1$. The emitter 71 is connected by means of a resistor 84 to a source of potential of positive polarity relative to ground, such as battery 86. The collector 75 is directly connected to the emitter 31 of transistor $T_1$, and thus is connected to ground by means of the load impedance 50.

In general, the operation of the amplifier depends upon the following action: as the applied signal causes variations in the impedance of the emitter-collector path of transistor $T_1$, the resultant signal developed in the collector circuit of transistor $T_1$ and applied to the base of transistor $T_2$ causes variations in the opposite direction in the impedance of the emitter-collector path of transistor $T_2$. Since the emitter-collector path of transistor $T_1$ completes a first circuit including the load impedance 50 and the battery 46, and the emitter-collector path of transistor $T_2$ completes a second circuit including the same load impedance 50 and the battery 86, the result of the mutually opposite changes in impedances presented by the two transistors to the two respective circuits is a flow through the load impedance of an amplified signal current which may vary in amplitude and polarity in accordance with variations in amplitude and polarity of the applied signal.

There are various modes of operation possible with the circuit arrangement shown in Fig. 1. One mode of operation deserving of consideration is that analogous to class A operation wherein both transistors are biased into the conductive state and signal variations do not drive either beyond cut-off. By suitable adjustments of the taps on potentiometers 43 and 83 to positions toward the negative terminals thereof, forward biases may be established between the respective base and emitter electrodes of each of the transistors, $T_1$ and $T_2$, to provide for class A operation.

It is possible by appropriate selection of the biases and circuit constants to establish equal no-signal currents through the two transistors. Under these conditions there is zero current flow through the load impedance in the absence of applied signals, as the entire no-signal D.C. current flow is through a path including the battery 46, the resistor 44, the emitter-collector path of transistor $T_1$, the emitter-collector path of transistor $T_2$, the resistor 84, and the battery 86. When an A.C. signal is applied to the base 33, the output signal current through the load impedance 50 is bidirectional: i.e. during positive swings of the applied signal, current from source 86 flows in one direction through the load impedance 50; while during negative swings of the applied signal, current from source 46 flows in the opposite direction through the load impedance 50.

The advantages of thus obtaining an amplified signal current output free of a D.C. operating current component are readily apparent. Direct coupling to subsequent amplification stages or other signal utilization devices is quite feasible. While the load impedance 50 has been illustrated symbolically as a resistor, it will be appreciated that the load may take other forms, such as the base-emitter path of another transistor, for example.

Another mode of operation, particularly advantageous for use with signal inputs having pulse waveforms, is that wherein transistor $T_1$ is biased into a heavily conductive state and transistor $T_2$ is biased to cut-off. This mode of operation may be established for the circuit arrangement of Fig. 1 by adjusting the position of the tap on potentiometer 43 to provide a substantial forward bias between the base 33 and emitter 31 of the transistor $T_1$, and by adjusting the position of the tap on potentiometer 83 to provide zero bias or a reverse bias between the base 73 and emitter 71 of the transistor $T_2$.

Figure 2:
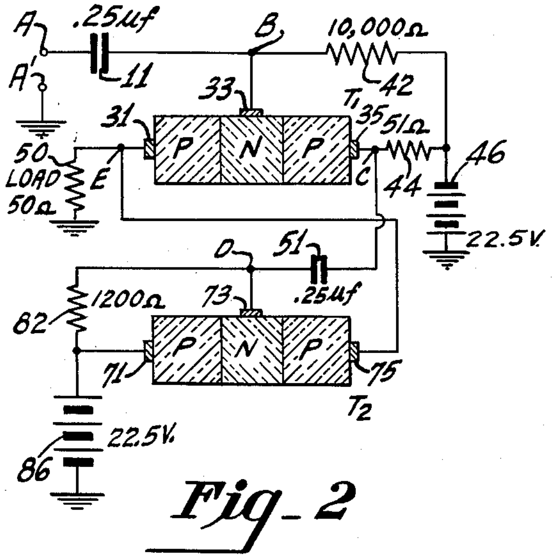
Fig. 2 is a schematic circuit diagram illustrative of a modification of the embodiment shown in Fig. 1, the modification being particularly adapted to amplification of a pulse input waveform.
Figure 3:
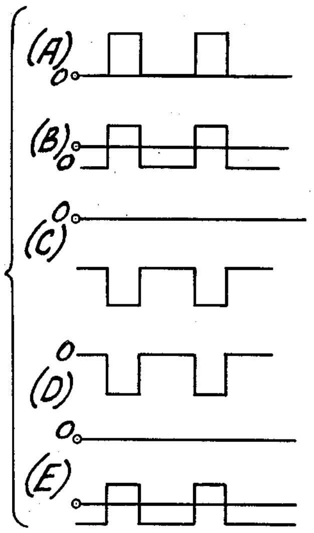
Fig. 3 illustrates voltage waveforms occurring at various points in the circuit of Fig. 2 when a pulse input is applied thereto.

Explanation of operation of the invention in the latter mode will be aided by reference to Fig. 2, which illustrates a modification of the previously discussed embodiment and which is particularly adapted to this mode of amplification of pulse waveforms. Corresponding elements in Figs. 1 and 2 have been designated by the same reference characters. Voltage waveforms occurring at various points in the circuit arrangement of Fig. 2 when input pulses are applied thereto are shown in Fig. 3.

The values of various circuit elements and voltages in Fig. 2 of the drawings are indicated thereon in ohms, microfarads, and volts. The various values of resistance, capacitance and voltage which have been designated have been found to provide satisfactory operating action. However, it will be understood that the values are given by way of example only, and they may be varied over a substantial range.

A substantial forward bias between base 33 and emitter 31 of transistor $T_1$ is provided by connecting the base 33 via the resistor 42 to the negative terminal of the collector voltage supply, battery 46, and by connecting the emitter 31 through the load impedance 50 to ground. The transistor $T_1$ is thus normally in a heavily conductive state, and a substantial current normally flows in a circuit including the load impedance 50, the emitter-collector path of transistor $T_1$, the collector resistor 44, and the collector voltage supply, battery 46. The direction of this normal current flow through the load 50 is toward the emitter 31.

The second transistor $T_2$ is normally cut off, the base 73 being connected via resistor 82 to the positive terminal of the emitter voltage supply, battery 86, to which the emitter 71 is directly connected. The collector 75 is directly connected to that terminal of the load impedance 50 to which the emitter 31 of the transistor $T_1$ is also connected. However, with the transistor $T_2$ in a non-conductive state, there is normally no completed D.C. path between the battery 86 and the load 50.

When an input pulse, of positive polarity relative to ground and of requisite amplitude, appears at the input terminals A, A′ and is applied via capacitor 11 to the base 33 of transistor $T_1$, the base 33 is driven to a potential more positive than the potential of emitter 31, and transistor $T_1$ cuts off. When current ceases to flow through the collector resistor 44, the collector 35 drops to the potential of battery 46. The negative voltage pulse thus generated is applied via capacitor 51 to the base 73 of the transistor $T_2$, driving the base 73 to a potential more negative than the potential of emitter 71 and thus rendering the transistor $T_2$ heavily conductive.

Thus during the signal pulse interval, a D.C. path is completed between the battery 86 and the load impedance 50 through the now conductive emitter-collector path of transistor $T_2$, while the normally closed D.C. path between the battery 46 and the load impedance 50 is open due to the cut-off of transistor $T_1$. Current flow through the load impedance 50 during the signal pulse interval is therefore in a direction opposite to the direction of the normal current flow, the current supplied by battery 86 flowing out of collector 75 through the load 50.

This mode of operation of the circuit arrangement of Fig. 2 will be more readily understood by consideration of the voltage waveforms shown in Fig. 3. The line designated 0 in each graph represents signal reference potential.

When an input pulse of positive polarity appears at input terminal A (see waveform A), the potential at base electrode 33 (waveform B) is driven from a negative potential determined by battery 46 to a positive potential producing cut-off of transistor $T_1$, and then returns to the negative potential upon the cessation of the input pulse. The potential at the collector electrode 35 (waveform C), normally at a potential less negative than the potential of battery 46 due to the voltage drop across collector resistor 44, drops upon the cut-off of transistor $T_1$ to the potential of battery 46, but returns to the less negative value when the termination of the input pulse returns transistor $T_1$ to a conductive state.

The negative pulse thus appearing at collector 35 is applied via capacitor 51 to the base electrode 73 of transistor $T_2$, driving the potential of base 73 (waveform D) from a positive potential determined by battery 86 to a less positive value for the duration of the input pulse interval. Since emitter 71 remains at the potential of battery 86, a forward bias is thus temporarily established between base 73 and emitter 71, and transistor $T_2$ is rendered conductive for the input pulse interval.

Waveform E shows the variations in the potential at point E, the terminal of the load impedance 50 to which both the emitter 31 and the collector 75 are connected. The potential at point E, normally negative as determined by the voltage drop across the load 50 when current flows through the load 50 toward emitter 31, rises upon the cut-off of transistor $T_1$ and the conduction of transistor $T_2$ to a positive potential determined by the voltage drop across load 50 when the current through load 50 flows out of collector 75. The potential at point E returns to the negative value upon the cessation of the input pulse, as transistor $T_1$ again conducts and transistor $T_2$ returns to cut-off condition.

It will be appreciated that the operation of the embodiment shown in Fig. 2 is somewhat analogous to the operation of a single-pole double-throw switch. That is, in the absence of an input pulse, the "switch" is thrown to a first position, due to the conduction of $T_1$, connecting point E through collector resistor 44 to battery 46. In the presence of an input pulse, the connection of point E to battery 46 is opened by the cut-off of transistor $T_1$, and the "switch" is thrown to a second position, due to the conduction of $T_2$, connecting point E to the battery 86.

While the voltage gain of the amplifier exemplified in Fig. 2 must of necessity be less than unity, current and power gains of the order of 30 or more are readily attainable. As the illustrative designation of 50 ohms for the load 50 indicates, the invention provides a practical circuit for supplying high current, high power, pulse waveforms to a low impedance load. As previously pointed out, the load while symbolically indicated by resistor 50, may take other forms, such as the base-emitter path of another transistor.

Thus, one particularly advantageous utilization of the embodiment shown in Fig. 2 would be its use to directly drive a transistor sawtooth current generator of the type disclosed in the copending application of George C. Sziklai, Serial No. 308,618, filed September 9, 1952, and entitled "Electronic Switching." In that disclosure, a bidirectional current of sawtooth waveshape is produced in an inductance coil connected in the emitter-collector circuit of a junction transistor, when pulses applied to the transistor's base electrode periodically open the emitter-collector circuit by reversing the direction of current flow in the base-emitter path of the transistor. If the bidirectional load current produced by present invention is allowed to flow in the base-emitter path of the generator circuit, sharply defined circuit opening and closing action insures accurately timed production of the sawtooth waves.

While the illustrated embodiments of the present invention have employed junction transistors of the p-n-p type, other embodiments employing n-p-n junction transistors in circuit arrangements similar to those shown (but with appropriate reversals of the polarity of the voltage sources) are equally practicable. It will be appreciated that, where n-p-n junction transistors are employed in circuit arrangements operating in the mode exemplified by Fig. 2, input pulses of negative polarity should be employed.

It will be further appreciated that other embodiments of the present invention employing transistors of the so-called point-contact type with circuit and electrode connections similar to those illustrated are also contemplated. However where the available point-contact transistor units have a tendency toward instability in a base input type of circuit arrangement, the embodiments employing transistors of the junction type will be preferable.

What is claimed is:

1. A signal amplifier comprising in combination, a pair of junction transistors each having base, emitter, and collector electrodes, a collector impedance element for one of said pair of junction transistors connected with the collector electrode thereof, means capacitively coupling the collector electrode of said one of said junction transistors to the base electrode of the other of said pair of junction transistors, means for applying an input signal to the base electrode of said one transistor, collector voltage supply means connected between the collector impedance element of said one transistor and a point of signal reference potential, emitter voltage supply means connected between the emitter electrode of said other transistor and said point of signal reference potential, a common load impedance element connected between said point of signal reference potential and both the emitter electrode of said one transistor and the collector electrode of said other transistor, means for applying operating bias to the base of said one transistor to render said one transistor normally conductive, and means for applying operating bias to the base of said other transistor to render said other transistor normally non-conductive.

2. A signal amplifier comprising in combination, a first junction transistor having base, emitter, and collector electrodes, a collector impedance element connected with said collector electrode, means for applying an input signal to said base electrode, collector voltage supply means connected serially with said collector impedance element between said element and a point of signal reference potential, means for applying a bias to said base electrode to render said transistor normally conductive, output load impedance means for the amplifier connected between said emitter electrode and said point of signal reference potential, a second junction transistor having base, emitter, and collector electrodes, emitter voltage supply means connected between the emitter of said second transistor and said point of signal reference potential, means for applying a bias to the base electrode of said second transistor to render the second transistor normally nonconducting, the collector electrode of said second transistor being direct-current conductively connected to the emitter electrode of said first transistor, and a coupling capacitor connected directly between the collector electrode of said first junction transistor and the base electrode of said second junction transistor.

3. A signal amplifier comprising the combination of: a first semi-conductor device including base, emitter, and collector electrodes; means for applying a bias voltage to the base electrode of said first device to render said first semi-conductor normally conductive; a second semi-conductor device including base, emitter, and collector electrodes; means for applying a bias voltage to the base electrode of said second device to render said second semi-conductor device normally non-conductive and open circuited; load impedance means; a first source of potential of one polarity relative to a point of reference potential; a second source of potential of the opposite polarity relative to said point of reference potential; a collector impedance element; means direct-current conductively connecting said load impedance means, the emitter-collector conductive path of said first device and said collector impedance element in series in the order named between said point of reference potential and said first source of potential to provide a first series circuit; means direct-current conductively connecting said load impedance means and the collector-emitter conductive path of said second device in series in the order named between said point of reference potential and said second source of potential to provide a second series circuit; input circuit means for applying input signals to the base electrode of said first semi-conductor device to change the impedance thereof, and means coupling the collector of said first device to the base of said second device to apply said signals to the second device and effect an opposite change in the impedance of said second semi-conductor device, current flow through said load impedance being amplified and variable in accordance with variation of said input signals.

4. A pulse amplifier comprising the combination of: a first semi-conductor device including base, emitter, and collector electrodes; a collector impedance element connected with the collector of said first device; means for applying a bias voltage to the base electrode of said first device to render said first semi-conductor device normally conductive; a second semi-conductor device including base, emitter, and collector electrodes; means for applying a bias voltage to the base electrode of said second device to render said second semi-conductor device normally non-conductive and open circuited; load impedance means; a first source of potential of one polarity relative to a point of reference potential; a second source of potential of the opposite polarity relative to said point of reference potential; means direct-current conductively connecting said load impedance means, the emitter-collector conductive path of said first device and said collector impedance element in series in the order named between said point of reference potential and said first source of potential to provide a normally closed series circuit; means direct-current conductively connecting said load impedance means and the collector-emitter conductive path of said second device in series in the order named between said point of reference potential and said second source of potential to provide a normally open series circuit; means connected for applying input pulses to the base of said first semi-conductor device to open said normally closed circuit; and means coupling the collector of said first device to the base of said second device to apply said signals to the second device and render said second device conductive, amplified current flow through said load impedance being variable in accordance with variation of said input pulses.

References Cited in the file of this patent

UNITED STATES PATENTS

| | | |
|---|---|---|
| 2,531,076 | Moore | Nov. 21, 1950 |
| 2,620,448 | Wallace | Dec. 2, 1952 |
| 2,662,938 | Goldstine | Dec. 15, 1953 |
| 2,666,818 | Shockley | Jan. 19, 1954 |
| 2,666,819 | Raisbeck | Jan. 19, 1954 |